United States Patent [19]

Bogaty

[11] Patent Number: 5,103,161

[45] Date of Patent: Apr. 7, 1992

[54] STRIPLINE FAST FARADAY CUP FOR MEASURING GHZ STRUCTURE OF ION BEAMS

[75] Inventor: John M. Bogaty, Lombard, Ill.

[73] Assignee: The United States of America as represented by the United States Department of Energy, Washington, D.C.

[21] Appl. No.: 547,748

[22] Filed: Jul. 3, 1990

[51] Int. Cl.$^5$ .......................................... G01N 27/62
[52] U.S. Cl. ...................................... 324/71.3; 324/72
[58] Field of Search ......................... 324/71.3, 72, 404

[56] References Cited

U.S. PATENT DOCUMENTS 4,703,256 10/1987 Hayafuji ............................. 324/71.3
4,922,196 5/1990 Rigg .................................. 324/71.3

FOREIGN PATENT DOCUMENTS 2700087 7/1978 Fed. Rep. of Germany ..... 324/71.3

Primary Examiner—Kenneth A. Wieder
Attorney, Agent, or Firm—Bradley W. Smith; John M. Albrecht; William R. Moser

[57] ABSTRACT

The Stripline Fast Faraday Cup is a device which is used to quantitatively and qualitatively measure gigahertz time structure characteristics of ion beams with energies up to at least 30 Mev per nucleon. A stripline geometry is employed in conjunction with an electrostatic screen and a Faraday cup to provide for analysis of the structural characteristics of an ion beam. The stripline geometry allows for a large reduction in the size of the instrument while the electrostatic screen permits measurements of the properties associated with low speed ion beams.

13 Claims, 4 Drawing Sheets

STRIPLINE FAST FARADAY CUP FOR MEASURING GHZ STRUCTURE OF ION BEAMS

CONTRACTUAL ORIGIN OF THE INVENTION

The United States Government has rights in this invention pursuant to Contract No. W-31-109-ENG-38 between the U.S.D.E. and the University of Chicago, operator of Argonne National Laboratory.

BACKGROUND OF THE INVENTION

It is important in the operation of research ion beam accelerators to conduct measurements of the radio frequency (RF) structure of an ion beam. One way to accomplish this is through the use of a Faraday cup. The Faraday cup is a device which is linked to a broad band transmission line as a means to quantitatively and qualitatively measure the gigahertz time structure characteristics of ion beams emulating from particle accelerators with energies ranging up to at least 30 Mev per nucleon. The Faraday cup is positioned to intercept and stop ion beams on the cup's surface. Ions striking the Faraday cup induce electrical signals which are amplified and viewed on a fast oscilloscope generating information about the RF structure and the intensity characteristics of the ion beam.

Several problem areas exist with existing instrumentation that do not employ a Faraday cup based measuring system. One problem is the appreciable attenuation of the beam which is necessary before surface barrier ion detectors can be used. Another problem is associated with the presence of the electric fields surrounding the particles. These fields precede the arrival of the ions to the measurement instrumentation and artificially broaden the bunch widths as measured from the Faraday cup.

Applicant's invention, the Stripline Fast Faraday Cup, employs a stripline geometry in place of a coaxial geometry and adds a forward electrostatic screen which acts as a shield to minimize the electric fields effects prevalent in advance of the ions arrival. The geometry of the Faraday cup dictates the stripline requirements, the electrostatic screen placement, and the associated modifications to the stripline in the maintenance of the proper bandwidth, sensitivity, and the effective electrostatic shielding of the device during ion beam measurements.

A comparison of applicant's invention to the only known commercial wide band Faraday cup instrument, Scientific International's, model DF 040 yields the following results. The bandwidth for the DF 040 is direct current (DC) to 2.0 gigahertz while that for the Stripline Fast Faraday Cup is DC to 6.1 gigahertz. Since the ability to resolve gigahertz RF structure is related to bandwidth, the narrower bandwidth DF 040 requires 175 picoseconds to resolve the ion beam bunch risetimes as compared to 57.3 picoseconds for the broader bandwidth associated with applicant's invention. Since the front window of the DF 040 can totally stop the ion beam before it impacts the Faraday cup surface, it is not suitable for ion beam bunch analysis; additionally, the drift space between the window and the Faraday cup surface is generally too large for effective shielding of the ion beam electric fields. Another area of dissimilarity occurs in the construction of the DF 040 which employs a coaxial geometry; whereas, applicant's invention, the Stripline Fast Faraday Cup, employs a microwave stripline technology. Finally, the DF 040 is intended for use with relativistic particles as opposed to slow moving ions; as a result, the measurements obtained for slow moving ions are adversely impacted. Thus, until applicant's invention no known Faraday cup instrument existed which was specifically designed to measure the RF bunching structure for ion beams to a full width half maximum of 100 picoseconds and for ion velocities and energies ranging up to 30.00 Mev per nucleon.

One of the objectives of this invention is to provide for beam bunch analysis in the bandwidth DC to 6.1 gigahertz.

Another objective is to provide for direct measurements of ion beam bunch widths down to a 100 picoseconds resolution for use with ion velocities down to 1% of the speed of light. Analysis of ion beams with velocities less than 1% of the speed of light are possible if the 100 picosecond resolution is not required; however, this resolution is achievable at the indicated velocities by reducing the drift space and adjusting the stripline impedance or the Faraday cup width. These measurements can be accomplished for beam intensities from 5.0 nanoamperage average to a 50 microamperage average with higher intensities possible with cup cooling.

Another objective is to provide for measurement of the bunched ion beam energy spread by incorporating a second bunching structure and comparing bunch time focus properties.

Another objective is to provide for ion beam contamination analysis through interpretation of the time structure spacing between bunch peaks within one buncher RF period.

Another objective is to use stripline technology to reduce the size of the instrument.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of instrumentalities and combinations particularly pointed out in the appended claims.

SUMMARY OF THE INVENTION

To achieve the foregoing and other objectives and in accordance with the purpose of the present invention, as embodied and broadly described herein, the present invention provides for measuring the time structure of ion beams with energies up to and exceeding 30 Mev per nucleon. A stripline geometry is coupled to an electrostatic screen and a Faraday cup to provide a means for measuring the characteristics of an ion beam. Ions from the beam strike the surface of the Faraday cup and induce an electrical signal which is then analyzed to provide information concerning the radio frequency structure and intensity of the ion beam. The ability to make these measurements is due in part to the electrostatic screen that is part of the wide stripline geometry.

DETAILED DESCRIPTION OF THE INVENTION

Figure 1:
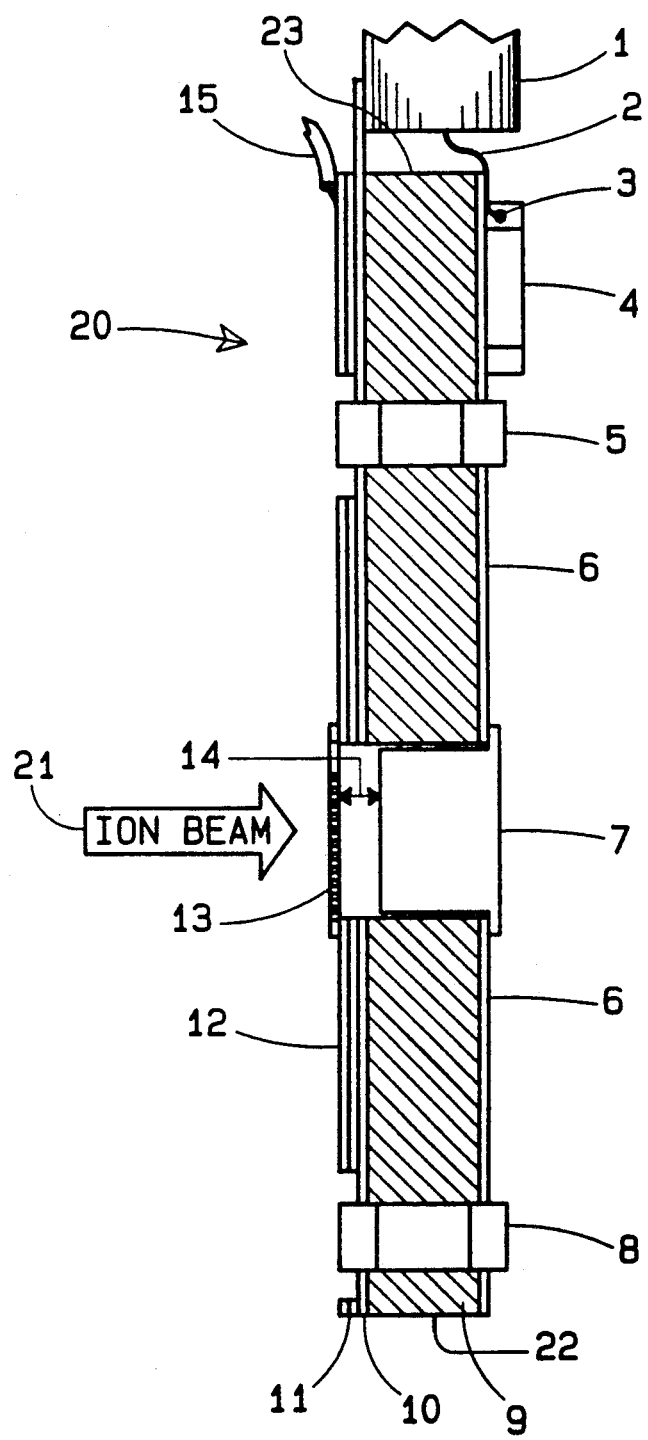
FIG. 1 is a cross sectional view of the Stripline Fast Faraday Cup.
Figure 2:
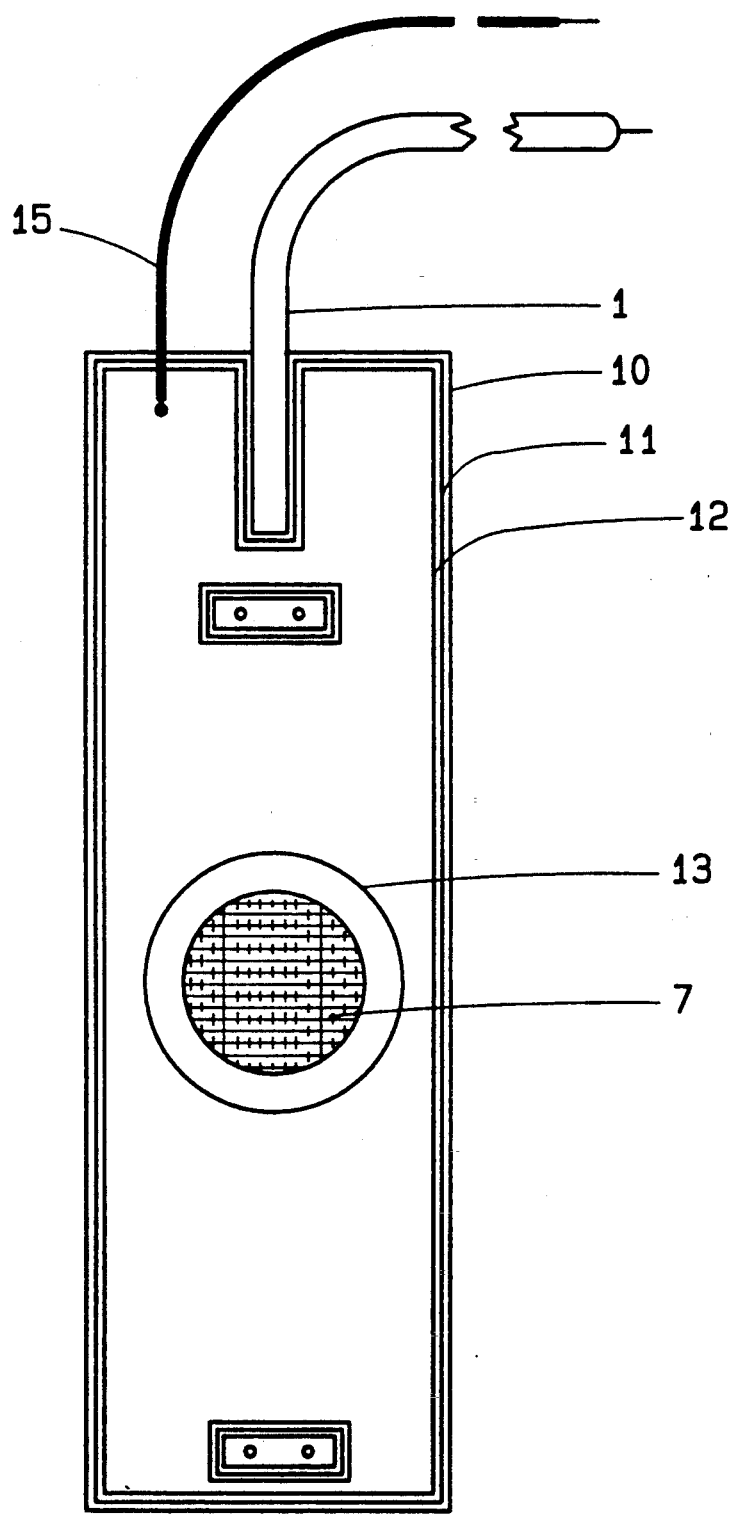
FIG. 2 is a front view of the Stripline Fast Faraday Cup.
Figure 3:
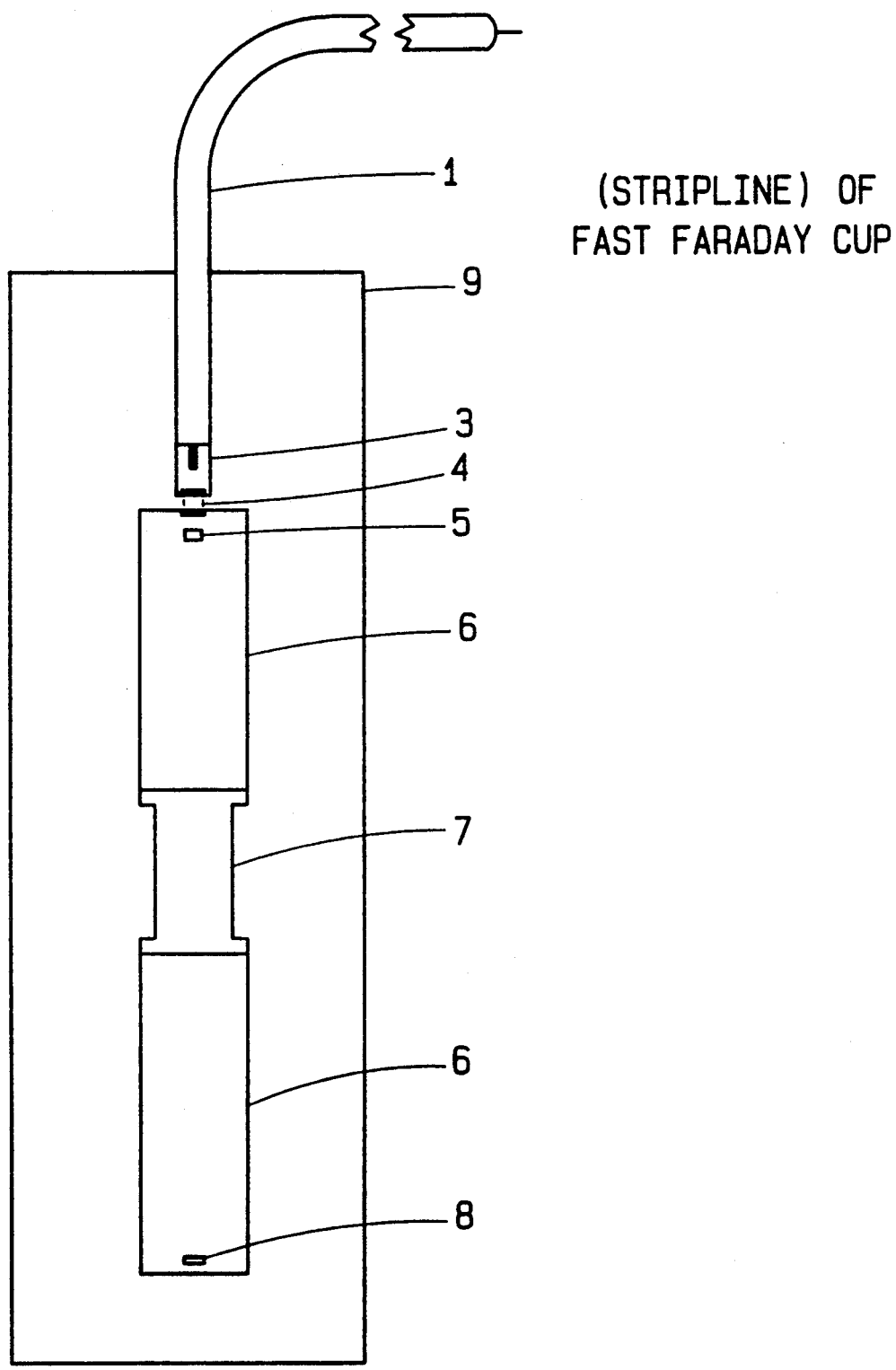
FIG. 3 is a rear view of the Stripline Fast Faraday Cup.

In FIG. 1, applicant's apparatus 20 for measuring the structure of ion beams employs a Faraday cup 7 coupled to a broad band transmission line as a means of measuring the structural characteristics of an ion beam. The present apparatus 20 represents a means for measuring the characteristics of a low velocity ion beam; however, a modification in the positioning of the structural components of the Stripline Fast Faraday Cup allows for its use with high speed ion beams.

Figure 4:
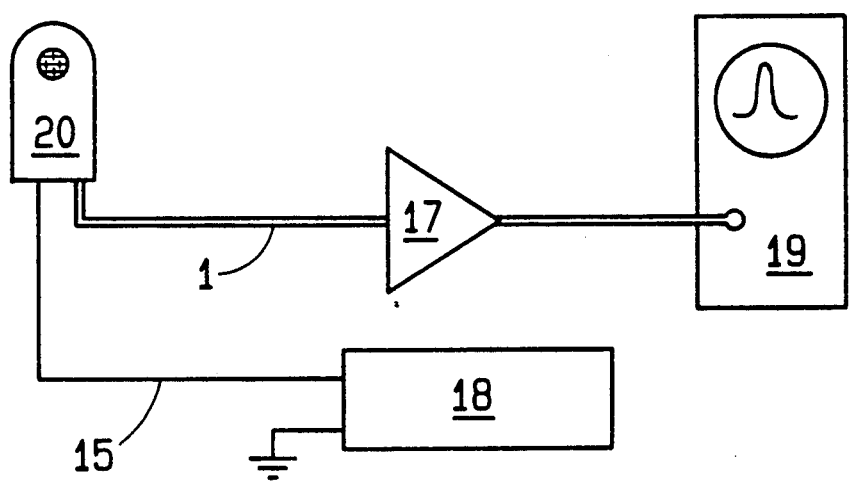
FIG. 4 is a schematic of the Stripline Fast Faraday Cup coupled to the respective measuring apparatus.

As illustrated in FIG. 1, a teflon printed circuit board dielectric 9 separates two conducting surfaces, an initial groundplane 10 and a stripline 6 respectively. A machined copper Faraday cup 7 is attached to the apparatus so that it partially transgresses the apparatus from the stripline 6 through a hole in the printed board dielectric 9 to a position where the Faraday cup face 30 is a distinct distance, namely the drift space 14, from an electrostatic screen 13. The Faraday cup 7 is electrically connected to the stripline 6. A teflon dielectric film 11 is used to separate the initial groundplane 10 from an isolated groundplane 12 which serves as a mounting surface for the electrostatic screen 13. The electrostatic screen 13 is electrically connected to the isolated groundplane 12 and a screen bias wire 15. This arrangement allows the screen 13 to establish an electrical bias with respect to the Faraday cup 7. The appropriate drift space 14 between the electrostatic screen 13 and the Faraday cup 7 is dependent on the velocity of the ion beam and the stripline RF impedance. The drift space 14 is a function of acceptable artificial ion bunch broadening and a good RF impedance match. One end 22 of the stripline 6 is terminated at its characteristic impedance. The other end 23 of the stripline 6 is impedance matched to a 50 ohm coaxial cable which carries the electrical signals to an outside measuring device 19, FIG. 4. A 50 ohm stripline segment 3 links the coaxial cable lead 2 to an impedance matching resistor 4. FIG. 1 depicts an ion beam 21 approaching the apparatus 20 where it interacts with an electrostatic screen 13 to which an electrical bias has been applied. The electrical bias is supplied by an external source 18, FIG. 4, using the bias screen wire 15. After transgressing the electrostatic screen 13, the ion beam impacts the Faraday cup 7 where the beam characteristics are sensed through the induced electrical current and the results conducted to an external measuring device 19, FIG. 4, by the 50 ohm coaxial cable 1, FIG. 1.

From FIG. 1, the Stripline Fast Faraday Cup is constructed by photoetching a teflon dielectric printed circuit board 9 to produce a low impedance stripline 6 with an opposing groundplane 10. The surface of the ground plane 10 is coated with a thin teflon dielectric film 11, and a second, isolated ground plane 12 is applied on top of the teflon film 11. The second groundplane 12 is electrically isolated from the stripline groundplane 10 but only for direct current voltages. The distributed nature of the second, isolated groundplane 12 constitutes a near ideal capacitor at microwave frequencies. A fine mesh electrostatic screen 13 is electrically bonded to the isolated groundplane 12 directly over the Faraday cup.

Initially, the stripline impedance may be incorrect at the screen's location because of the air gap. The Faraday cup geometry is then modified at the screen's 13 location to re-establish an impedance which matches the rest of the stripline. To reestablish the impedance match, the geometry may be modified by various methods well known in the art. For example the geometry modification referenced to above may consist of altering the thickness of the face of the Faraday cup 7, and thus, changing the drift space 14 between the electrostatic screen 13 and the Faraday cup 7. One of the methods which may be used to determine if the proper drift space 14 has been attained is through the application of Time Domain Reflectometry where the external measuring device 19 is used to match the impedance of the Faraday cup 7 to the impedance of the stripline. When the modified stripline portion is correctly configured, it will maintain a near perfect impedance match with the rest of the structure and extreme bandwidth will be realized. The airgap or drift space between the electrostatic screen 13 and the Faraday cup 7 is very important. A small gap dimension minimizes drift space between the screen 13 and Faraday cup 7 for incoming ions and therefore greatly reduces artificial beam bunch width broadening of output signals. Applicant's low ion velocity beam design has a screen 13 to Faraday cup 7 gap or drift space of 0.0131 inch (⅓ mm) allowing picosecond time structure measurements of low velocity ion beams down to 1% the speed of light. An alternate high beta design permits measurements of ion beams with velocities greater than 10% the speed of light by widening the electrostatic screen 13 to cup 7 spacing and increasing the RF stripline impedance through the use of a thicker teflon dielectric 9 which limits the bandwidth to about 6.0 gigahertz and a cup timing response of 60 picoseconds. For example, if the RF stripline impedance were increased to 50 ohms, impedance matching to enhance the output efficiency of the signal transmitted to the measuring device 19 could be achieved by removing the impedance matching resistors, 4 and 5, and adjusting the terminating resistor 8 to match the 50 ohm stripline.

To effectively reduce the reflections of RF current from unterminated areas of the stripline ends, terminating resistors 8 are mounted across the stripline end widths.

The use of stripline geometry also permits a significant reduction in the physical size of the instrument when compared to prior instrumentation.

The invention has an extremely wide frequency response or bandwidth and is able to measure gigahertz structure for slow moving ion beams. The ability to measure gigahertz structure for ion beams is due to the use of a high transmission electrostatic screen 13 as part of the wide bandwidth RF stripline geometry utilized in the invention. For an unshielded Faraday cup, the electric field associated with the charged particle making up the ion beam interacts with the Faraday cup before the actual arrival of the ion to the cup's surface. This interaction of the ion's electric field with the cup's surface results in a reduction of the effective high frequency performance of the system to an extent that is dependent on the velocity of the incident ion. This results in the measured bunch widths appearing wider in time than their actual value. The invention minimizes this problem by requiring the ions to pass through an 80% transmission electrostatic screen 13 and by providing for a drift of only ⅓ mm 14 prior to striking the stripline Faraday cup 7. The screen 13 inhibits most of the ion associated electric field from coupling with the Faraday cup 7 surface until the ions enter the screen. The gap between the screen and the cup is so short that electric field corruption of bunch width signals is minimized even for slowly moving ions. The very short drift space is critical to measuring gigahertz time structure of ions down to 1% of the speed of light. RF impedance at the Faraday cup 7 must match with the rest of the stripline structure. As a result, the Faraday cup 7 width is adjusted to produce a match with the remaining stripline impedance; this matching produces the inventions expansive bandwidth of DC to 6.1 gigahertz. Electrical signals can be taken from either end of the terminated stripline. Wide bandwidth amplifiers 17 are used to amplify the signals before displaying them on an oscilloscope 19.

The Stripline Fast Faraday Cup's 20 high transmission electrostatic screen 13 is an integral part of the stripline ground-plane geometry. This feature allows the screen to be part of and, in fact, essential to constant RF impedance as signal currents propagate along the stripline. In addition, the application of a DC bias to the screen 13 enhances the Faraday cup's 7 sensitivity for low intensity ion beams. Depending on the desired effect, the screen 13 can be biased several hundred volts positive or negative with respect to the cup 7 itself. If the bias is positive, the electrons are knocked off the stripline Faraday cup 7 and accelerate towards the screen 13. This enhances the sensitivity of the Faraday cup 7 for weak ion beams. When the bias is negative, electrons are suppressed back into the Faraday cup 7 surface which decreases sensitivity but enhances time resolution based on the bias magnitude. In theory, if the bias is high enough, the stripline Faraday cup's time resolution will not be affected regardless of polarity. If precise measurement of the beam bunch peak current is desired, then electron suppression or negative screen bias is required.

The embodiments of the invention in which an exclusive property or privilege is claimed are defined as follows:

1. An apparatus for measuring the structure of ion beams comprising:
   a dielectric strip with an opening therethrough to create an air gap from one side of said dielectric strip to the other;
   a conductive stripeline bonded to one side of said dielectric strip and a groundplane bonded to the opposing side of the dielectric strip wherein said airgap remains open;
   a thin dielectric film coating said groundplane;
   a second groundplane adhering to said thin dielectric film wherein a portion of said thin dielectric film adjacent to said air gap is exposed;
   a fine mesh electrostatic screen bonded to said second groundplane directly over said air gap;
   means for matching the impedance at said electrostatic screen with that of said stripline;
   a Faraday cup mounted opposite said electrostatic screen with a drift space between said electrostatic screen and said Faraday cup;
   means for reducing RF reflections from said stripline through the use of a terminating impedance;
   means for biasing said electrostatic screen;
   means for outputting information to an amplifier; and
   a measuring device coupled to said amplifier where said measuring device receives information from said amplifier.

2. The apparatus of claim 1 where a teflon dielectric printed circuit is photo-etched to produce said low impedance stripline with said opposing groundplane.

3. The apparatus of claim 1 where the impedance matching means is accomplished through the use of a plurality of surface mounted impedance matching resistors.

4. The apparatus of claim 3 where the drift space between said electrostatic screen and said Faraday cup is ½ mm.

5. The apparatus of claim 4 where a plurality of terminating resistors are coupled between the groundplane and the stripline.

6. The apparatus of claim 1 where said stripline linking said coaxial cable to said first impedance matching resistor has a value of 50 ohms.

7. The apparatus of claim 6 where said stripline linking said impedance matching resistor to said Faraday cup and said Faraday cup to said terminating resistors has a value of 24 ohms.

8. The apparatus of claim 7 where said first surface mounted impedance resistor couples said 50 ohm stripline to said 24 ohm stripline and where said second surface mounted impedance resistor couples said 24 ohm stripline to said groundplane.

9. The apparatus of claim 8 where said terminating resistors couple said 50 ohm stripline to said groundplane.

10. The apparatus of claim 1 where said thin film dielectric is teflon.

11. The apparatus of claim 1 where said electrostatic screen is a photo-etched molybdenum electrostatic shield.

12. The apparatus of claim 1 where said drift space is increased to permit analysis of higher speed ion beams.

13. The apparatus of claim 12 where a thicker dielectric is used to permit analysis of higher speed ion beams.

* * * * *